US006492613B2

(12) United States Patent
Bollinger et al.

(10) Patent No.: US 6,492,613 B2
(45) Date of Patent: Dec. 10, 2002

(54) SYSTEM FOR PRECISION CONTROL OF THE POSITION OF AN ATMOSPHERIC PLASMA

(75) Inventors: Lynn David Bollinger, Ridgefield; Iskander Tokmouline, New Fairfield, both of CT (US)

(73) Assignee: Jetek, Inc., Ridgefield, CT (US)

( * ) Notice: Subject to any disclaimer, the term of this patent is extended or adjusted under 35 U.S.C. 154(b) by 0 days.

(21) Appl. No.: 09/855,299

(22) Filed: May 15, 2001

(65) Prior Publication Data

US 2002/0030038 A1 Mar. 14, 2002

Related U.S. Application Data (60) Provisional application No. 60/204,103, filed on May 15, 2000.

(51) Int. Cl.[7] .............................................. B23K 10/00
(52) U.S. Cl. .......................... 219/121.54; 219/121.57; 219/123; 219/121.59
(58) Field of Search ....................... 219/121.48, 121.52, 219/121.57, 121.36, 121.59, 121.54, 123; 156/345; 315/111.31–111.81, 111.01

(56) References Cited

U.S. PATENT DOCUMENTS

| | | | | |
|---|---|---|---|---|
| 3,786,306 A | * | 1/1974 | Schoumaker | 315/111.31 |
| 5,235,160 A | * | 8/1993 | Suzuki et al. | 219/121.52 |
| 5,474,642 A | * | 12/1995 | Zorina et al. | 156/345 |
| 5,489,820 A | | 2/1996 | Ivanov et al. | 315/11.51 |
| 5,565,249 A | | 10/1996 | Kurihara et al. | 427/577 |
| 5,767,627 A | | 6/1998 | Siniaguine | 315/111.41 |

* cited by examiner

Primary Examiner—Mark Paschall
(74) Attorney, Agent, or Firm—St. Onge Steward Johnston & Reens LLC (57) ABSTRACT

Multiple plasma jet path sensing positions and multiple localized steering magnetic fields for each plasma jet leg in an atmospheric plasma jet control system are described for a precise control over positions of plasma jet legs as well as their directions in a vertex zone, where a hot gas stream is generated for treatment of a semiconductor device. With a plasma jet generator system in accordance with the invention precise control over the plasma jet legs enables one to virtually eliminate plasma jet path instability at the vertex region.

17 Claims, 8 Drawing Sheets

SYSTEM FOR PRECISION CONTROL OF THE POSITION OF AN ATMOSPHERIC PLASMA

PRIOR APPLICATION

This application is a continuation-in-part of prior provisional application No. 60/204,103, filed May 15, 2000 in the US Patent and Trademark Office and assigned to the same assignee as for this patent application and which is incorporated herein by reference thereto.

FIELD OF THE INVENTION

This invention generally relates to a system and method for using an atmospheric plasma in the processing of substrates and particularly to the fabrication of semiconductor devices. More specifically this invention relates to a method and system to regulate the position of a plasma jet used to produce an intense hot gas stream employed in the manufacture of semiconductor devices such as Miniature Electro-Mechanical Systems (MEMS).

BACKGROUND OF THE INVENTION

An atmospheric arc-type plasma referred to as a plasma jet may be used for processing substrates used in the manufacture of semiconductor devices. An atmospheric, plasma jet generation system has previously been described; see the International patent WO9746056, by Siniaguine, entitled "Apparatus for generating and deflecting a plasma jet." This atmospheric plasma provides a means for generating an intense, hot gas stream that subsequently can be used for processing a substrate. Processing of the substrate may include: etching by reactive species generated in the hot gas stream; deposition resulting from species introduced into the gas stream; and thermal processing of the substrate by the heat flux carried to the substrate by the hot gas stream. An etching application for polymer removal, has previously been disclosed in the prior International patent pending application no. PCT/US00/27113 by Bollinger and Tokmouline and which is entitled: "Atmospheric process and system for controlled, rapid removal of polymers from high depth to width aspect ratio holes." The application of very rapid thermal processing has been disclosed in International patent pending Application No. PCT/US00/41492 by Bollinger and Tokmouline "Method for rapid thermal processing of substrates."

Figure 1:
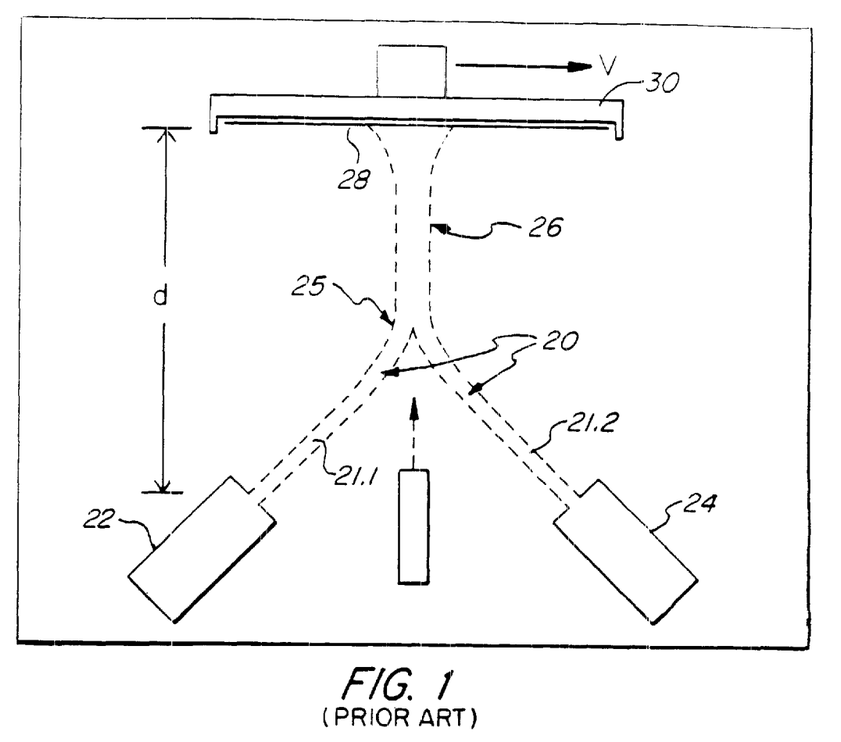
FIG. 1 is a vertical elevation schematic view of an atmospheric plasma jet system as is known in the prior art to generate an intense hot gas stream and treats a substrate.

This atmospheric plasma as used in these prior international patent applications is shown in FIG. 1 and is also described in the aforementioned patent applications by Bollinger and Tokmouline. In such system, an arc-type electrical discharge or plasma jet 20 is generated between two electrode subassemblies, an anode 22 and a cathode 24. The geometric configuration of the generated plasma jet 20 is such that it creates a vertex 25 where an intense hot gas stream 26 is produced that is directed toward a substrate or wafer 28 that is to be processed by the stream 26. The substrate 28 is held in a substrate holder 30 that is moved through the hot gas stream. Control and repeatability of the hot gas stream 26 is critical for highly controlled, repeatable treatment of the substrate.

Figure 2:
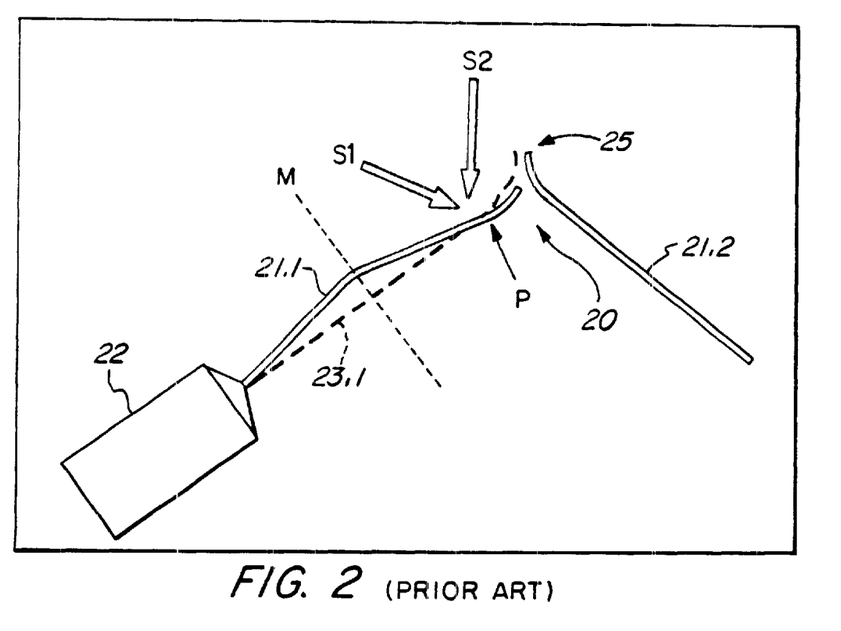
FIG. 2, is a side view in elevation of one half of a plasma jet control in accordance with the prior art for the generation of a hot gas stream.

Arc-type plasmas by their nature involve electrical current flow and are well known for unstable behavior. Stabilization using this type of plasma generation system is accomplished in the prior art as illustrated in FIG. 2 by an optical sensing of the plasma jet position at P with optical sensors such as a CCD camera. These generate an image into a computer, which produces a feedback signal, not shown, to a steering magnetic field M. The magnetic field M is intended to correct for a sensed deviation in the plasma jet path position as shown from the solid line at 20 to the dashed line at 20'. In the prior art the adjustment possible with a single magnetic field does not lend itself for compensating for both a positional and angular alignment of the jet at the vertex 25. Hence, the repeatability of a process as measured by uniformity of treatment by gas stream 26, U%, has been limited to approximately 5%.

$$\%U = 100 \times (\text{max. treatment} - \text{min. treatment})/(\text{ave. treatment}) \quad (1)$$

Where "treatment" refers to a measured process result depending on the application, such as etch depth in an etch application or diffusion depth of a doping impurity in a thermal processing application. For some applications, such as for stripping photoresist from a wafer in which the etch selectivity to the layer underlying the photoresist is practically infinite, this process repeatability is sufficient. For other applications, such as for very rapid thermal processing as described in the above referenced in patent application PCT/US00/41492, thermal treatment to better than 1% is needed.

Prior literature has described the concept of optically sensing the plasma jet position from its light emission and feeding back the sensed position to magnetic fields applied to the plasma jet over a single localized area to stabilize and to re-adjust the plasma jet position. Localized magnetic fields applied to a localized area of the plasma jet have been described in open literature and patent disclosures. A three magnetic pole geometry is described in the International patent WO9212610 by Pavlovich et al "Device for plasma-arc processing of material." Four magnetic pole configurations are described in the Russian patent RU2059344 by Siniaguine "Plasma current generating device;" in the International patent WO9746056 by Siniaguine "Apparatus for generating and deflecting a plasma jet;" and WO9831038 by Siniaguine "Plasma generation and plasma processing of materials." In these configurations, the position of each leg of the plasma jet is sensed at one location and a steering magnetic field is applied at one location.

The magnetic fields are generated by electromagnets. Changing the electrical current to the coils in the magnetic circuits varies the applied magnetic field strength. Response time to a sensed change in the path position to magnetically correcting the path position can be fast. Feed back loops with response time near 1 msec have been demonstrated. However, these magnetic field configurations are limited in their capability to precisely control the plasma jet position with consequent limitation in control of the treatment of the substrate.

The prior art of sensing the plasma jet path position at a single point and feed-back control to the magnetic field applied to one localized position cannot precisely control the plasma jet position and direction in the vertex region where the hot gas stream is generated. The difficulty arises from variations in the direction of the plasma jet path as it emerges from the electrode assemblies 22 and 24. Particularly for the cathode assembly 24, the path direction of the emerging plasma jet varies from one position to another within a cone concurrent with the longitudinal axis of the electrode assembly. It is believed this variation in the path direction originates from a variation in the position of the electron emission spot on the emitting surface within the electrode assembly.

The prior art optically senses the position of each leg 21.1 (PJ1) and 21.2 (PJ2) of the plasma jet 20 and to feed-back any deviation from a pre-set position to a localized magnetic field whose strength and direction may be varied to bring the plasma jet position back to the pre-set position at the optical sensing point. Optical sensing of the path position at a given location is conveniently done by using two optical sensors, S1 and S2, at different positions that are aligned to pick-up the emitted light from that given location on the plasma jet path. The optical signal is fed from each sensor position to a photo-sensitive array such as contained by a CCD camera. The electrical current output from the pixels in the photo-sensitive array along with the geometry of the positioning of two optical sensors, which view the plasma jet position, can then be used to determine the position of the plasma jet at the given, sensed location.

Magnetic field configurations using three and four magnetic poles, referenced above, apply a localized magnetic field that can be varied in intensity and direction in the two directions perpendicular to the plasma jet path direction. The current in the plasma jet then responds to a force by the applied magnetic field according to the well-known relation:

$$dF=I(dl \times B) \qquad (2)$$

where: dF is the force that results from an applied magnetic field, B, on the current element of length $dl$ (i.e., plasma jet element of length $dl$) through which a current, i is flowing. The direction of dF is perpendicular to both the directions of the current, i, and the applied magnetic field, B. dF, $dl$ and B are vectors. "x" denotes the standard vector cross-product that applies the component of B that is perpendicular to $dl$.

According to (2), the plasma jet path direction will change in a direction perpendicular to the applied magnetic field direction. Various design configurations for the magnetic poles that apply the localized magnetic field may be used. The common feature of each must be that the field direction and intensity be variable in two directions perpendicular to the plasma jet path direction.

FIG. 2 shows how use of the prior art for correction of a variation in the plasma jet path cannot provide a precise correction to the position and the direction of the plasma jet at the vertex where the hot gas stream is generated. The heavy dashed line 23.1 for the path of plasma jet leg PJ1 is a path with no deviation as shown in FIG. 2. The solid shaded line 21.1 for PJ1 is a path for which the plasma jet emerges from the electrode assembly at an angle to the normal or non-deviated path.

In the prior art, a magnetic field is applied to each leg of the plasma jet at a single localized area. In FIG. 2, the components of the applied magnetic field perpendicular to the path direction are shown in a plane M for the plasma jet leg PJ1. The path position for each leg of the plasma jet is sensed at a single position. In FIG. 2 the position of PJ1 is sensed at position P. Two optical sensors S1 and S2 look at position P from two directions to provide the information needed to determine the 3-dimensional position of the leg of the plasma jet PJ1 at P. This position is fed-back to a magnetic control system, not shown in FIG. 2, that applies magnetic fields that can be varied in intensity and direction at the localized position M.

If the optical sensing system detects that the plasma jet position has changed from a desired position, the magnetic field is changed to bring the sensed path position back to the controlled position at P (see the dashed path 23.1 for PJ1). As shown for the deviated path in FIG. 2, the localized magnetic field applied at M is changed to bring PJ1 to its pre-set position at P. To make this correction, the magnetic field intensity in the direction perpendicular to the plane of the paper would be changed. However, as shown by FIG. 2, even though the plasma jet path 21.1 is at the correct position at the sensing position P, the direction, i.e. its vector, and the position of the path of PJ1 at the vertex 25 is changed to a less desired position as represented by the dashed path 23.1 at the vertex 25.

Consequently, there is a variance in the hot gas stream generated at the vertex. FIG. 2 shows a 1-dimensional variation in the plasma jet path. In practice the path variation and the magnetic field feedback control is in 2-dimensions. The variation in the position and direction of the plasma jet after correction of a variation can be reduced by making the sensed path position P close to the vertex 25 but optical interference from the second plasma jet PJ2 limits how close P may be to vertex 25. In practice the best positioning attainable with single position sensing as employed by the prior art yields a process stability control that is of the order of about 5%. For many substrate processing steps, such as the rapid thermal processing as described in the aforementioned patent applications by Bollinger et al, this stability is inadequate.

SUMMARY OF THE INVENTION

This invention discloses a plasma jet generator, using a magnetic field system, including optical position sensing, that gives precise control, typically better than about 1%, with 0.1% being obtainable, either over the position of the plasma jet at the vertex or with the processing steps conducted with the hot gas stream obtained from the plasma jet. Hence, and in particular, such control relates to the use of a hot gas stream that subsequently processes a substrate. For precise control over the plasma jet legs in accordance with the invention a means is provided with which a precise control over the position of the plasma jet in the region where the hot gas stream, that processes the substrate, originates.

This is achieved in accordance with one feature of the invention by using multiple plasma jet path sensing positions and multiple localized steering magnetic fields for each plasma jet leg so that their positions as well as their directions in the vertex zone, where the hot gas stream is generated, are precisely controlled. With a plasma jet generator system in accordance with the invention one can virtually eliminate plasma jet path instability at the vertex region.

This invention solves the problem of the limitation on treatment uniformity resulting from lack of precise control of the plasma jet direction and position in the region where the hot gas stream is generated. This disclosure recognizes that this lack of control:

1. Arises from the variation of the plasma jet path as it emerges from the electrode assemblies.

2. That prior art control configurations, consisting of sensing the path position at a single position and changing the path position by applying a localized magnetic field at a single position, are limited in capability to correct resulting plasma jet path deviations.

In accordance with one embodiment of this invention, the position of both the arms of the plasma jet are each optically sensed at two or more positions, and, magnetic fields are applied at separate areas to each leg of the plasma jet to allow precise positioning of the two legs of the plasma jet where they meet and generate the hot gas stream.

In accordance with another embodiment of the invention only the position of the cathode originating arm or leg of the plasma jet is precisely controlled with a second optical sensor and magnetic field control because the other anode arm is more stable.

In still another form of the invention, the voltage between the cathode and anode assemblies is monitored and variations of the voltage are attributed to a change in the position of a plasma jet leg and thus used to adjust the plasma leg position with a second magnetic field.

It is, therefore, an object of the invention to provide a plasma jet generator and a method with which a precise control over the plasma jet position at a vertex where a hot substrate processing gas stream is produced is obtained.

It is a further object of the invention to produce a method and apparatus with which a highly improved control, typically in the range from about five to 10 to one or better, over the processing of a substrate with a hot gas stream is obtained.

These and other objects and advantages of the invention can be understood from the following detailed description of several embodiments in conjunction with the drawings.

DETAILED DESCRIPTION OF THE DRAWINGS

Figure 3:
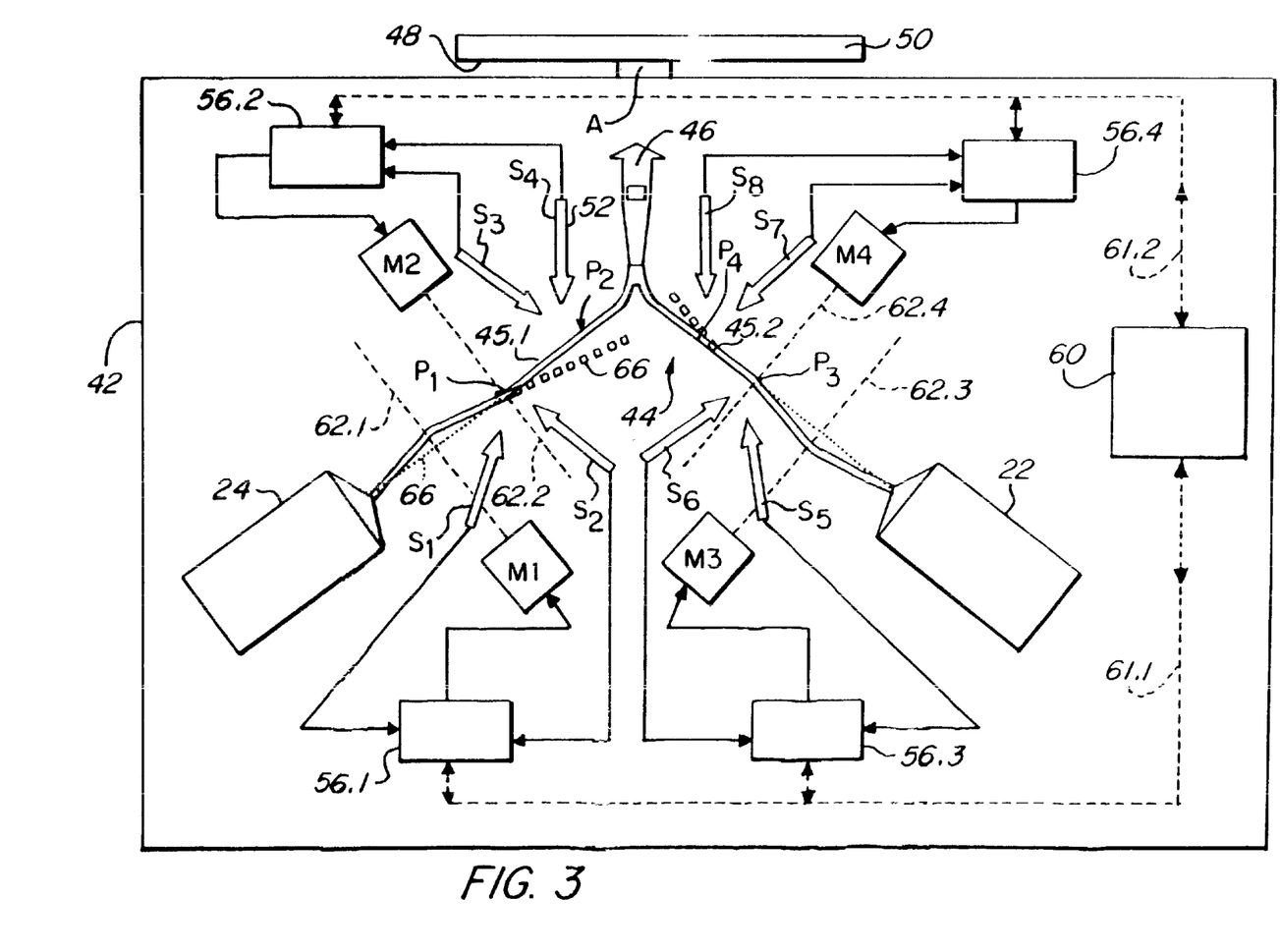
FIG. 3 is a vertical elevation schematic view of an atmospheric plasma jet generator in accordance with the invention.
Figure 4:
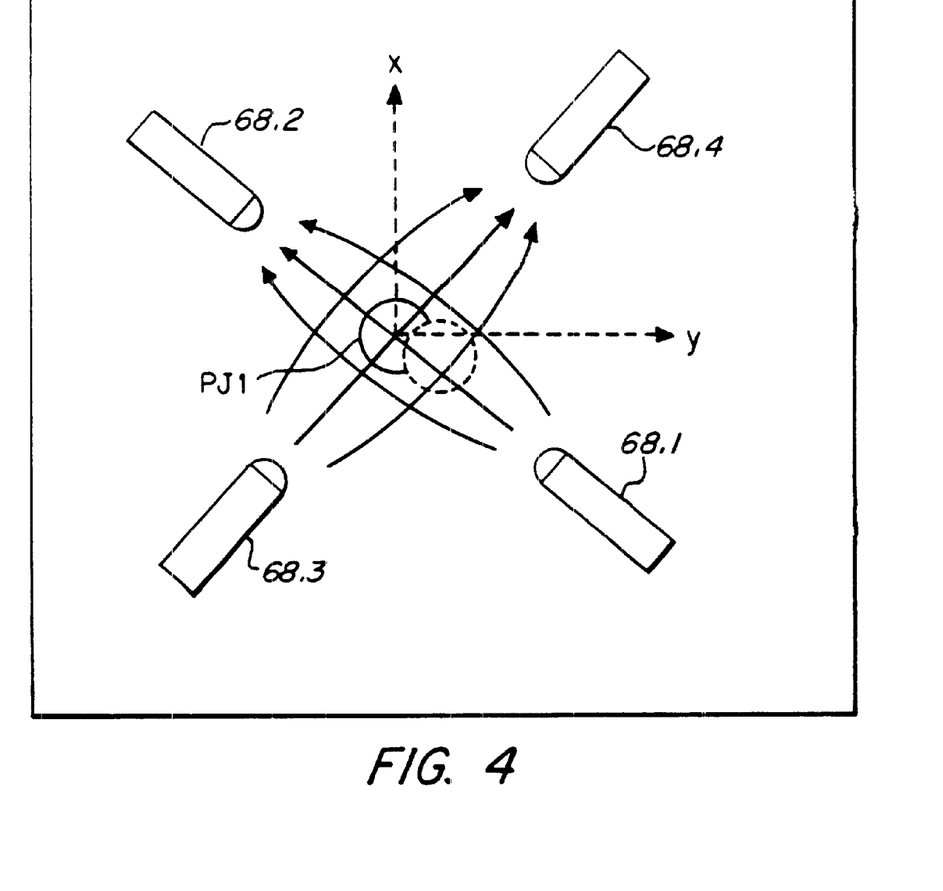
FIG. 4 is a view of a plasma jet generator taken along the direction of travel of the plasma jet produced by the generator of FIG. 3.
Figure 7:
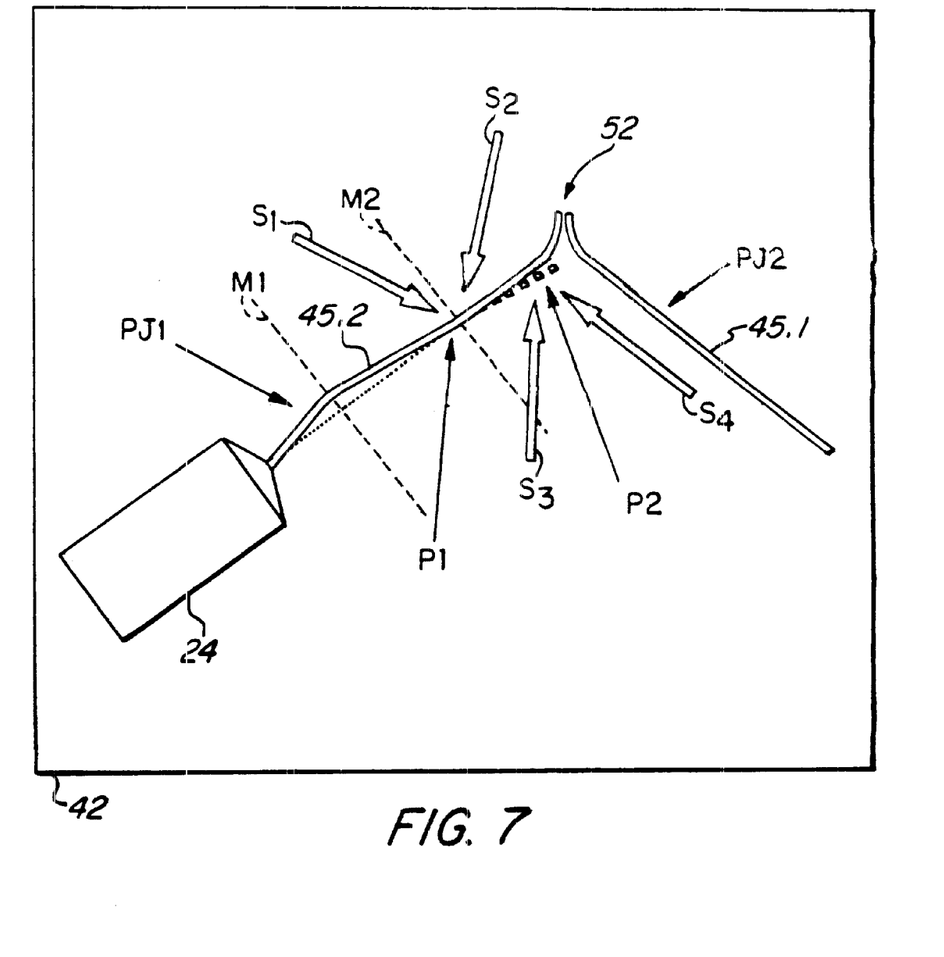
FIG. 7 is a vertical elevation view of one portion of the plasma jet generator in accordance with the invention.

With reference to FIGS. 3, 4 and 7, an atmospheric hot gas stream apparatus 40 in accordance with the invention is shown within a chamber 42. The apparatus 40 uses a high temperature, arc type plasma generated in an inert gas such as argon, between two electrode subassemblies, an anode 22 and a cathode 24, for the arc discharge referred to as a plasma jet 44. The plasma jet 44 formed by the electrode configuration creates a hot gas stream at 46 directed at the substrate surface 48 of a substrate 50 used to manufacture semiconductor devices. Other suitable ambient gases may be employed inside the chamber 42.

The substrate or wafer 50 to be processed is moved through the treatment area formed by the hot gas stream using a suitable actuator that is not shown. A non-contact substrate holder that provides uniform processing and rapid heat removal from the substrate is described in U.S. patent pending application Ser. No. 09/689,307 by Bollinger and Tokmouline and entitled "Wafer holder for rotating and translating wafers."

A gas injector, not shown in the view of FIG. 3, may be used to inject a gas into the hot gas stream. Without a flow of gas from the gas injector, the hot gas stream is composed primarily of the inert gas from the two electrode assemblies 22 and 24 and from the process chamber ambient gas that is entrained into the hot gas stream 46. The hot gas will dissociate the injected material, gas or powder, so the gas flux at the substrate surface 48 is primarily composed of atomic constituents.

The temperature of the hot gas stream, at the boundary layer over the substrate, may be controlled by the distance d, see FIG. 1, of the electrode assemblies from the substrate as well as the electrical power into the arc type plasma jet. Typical power parameters for driving the arc plasma may be in the ranges of 125 to 250V and 60 to 150 Amps and such power is obtained with a power supply, not shown. A typical distance for d is in the range of 5 to 20 cm. A typical separation of the electrode assemblies is in the range of 10 to 30 cm.

The size of the treatment area generally denoted as A, where the hot gas stream 46 is incident upon the substrate surface 48, is approximately 2 cm diameter, normally less than the size of the substrate 50 to be processed (e.g., a 200 mm or 300 mm diameter silicon wafer). Area A may be in the range of 0.5 cm to 5 cm. Area A need not be circular but can be elliptically shaped by choice of the plasma generation parameters and gas injected into the hot gas stream, such as by the gas injector.

FIG. 3 shows a plasma jet path with no path variation. Two electrode assemblies 22 and 24 generate a combined plasma jet 44. FIG. 3 shows the two legs PJ1 or 45.1 and PJ2 or 45.2 of the plasma jet coming from each electrode assembly 22 and 24. In operation, the two legs 45.1 and 45.2 of the plasma jet 44 combine so that there is current flow along the paths from one electrode to the other. The stream of hot gas 46 is generated at the vertex 52 where the two plasma jet legs meet.

The position and direction of the two plasma jet legs, PJ1 and PJ2, at the vertex 52 is critically important to obtaining a very repeatable and controlled hot gas stream 46; and consequently, a highly repeatable and controlled processing of the substrate 50.

FIG. 3 shows multiple sensing locations P1, P2 and P3, P4 and multiple magnetic field adjustments at M1, M2 and M3, M4 for plasma legs 45.1 and 45.2 respectively. Since the major contribution to plasma jet path variations result from misdirected exiting of the plasma jet from the electrode assemblies 24, 22 at various angles within a cone about the center axis of the electrode assembly, these multiple position sensors and magnetic adjustments are used to provide a precise and desired alignment of the plasma jet at the vertex 52. This feature is illustrated with the solid line for the plasma jet path 44.

For example, for plasma leg 45.1 localized magnetic fields M1 and M2 are applied at two positions. The intensity and direction of the magnetic fields at each location can be varied in the 2-dimensions perpendicular to the plasma jet path direction. The plasma jet path position is sensed at two locations, P1 and P2, on the plasma jet path by photo sensors, which can be CCD type devices. Two pairs of optical sensors S1, S2 and S3, S4 are used to look at two positions on the plasma jet path to provide information needed to determine the 3-dimensional position of the plasma jet at location P1 and P2.

The two path sensing positions P1 and P2 and the two magnetic field locations may be at different relative positions than the geometry shown in FIG. 3. However, by sensing the position of the plasma jet at P1 essentially in alignment with the adjustment by the M2 magnetic field, the algorithm needed to determine the correct position of the plasma jet 45.1 is simplified. In general, an algorithm that includes the geometric positions of the magnetic field locations and the path sensing locations could be used to obtain the correct direction and position of the plasma jet leg 45.1 at the vertex 52.

Optical sensors S1, S2 and S3, S4 respectively feed their outputs to controls 56.1, 56.2 respectively. These controls individually are well known for deriving the location of the plasma jet leg at which the associated sensors are directed. Typically such controls can be part of a computer control 60 of which the controls 56 can be a part, as suggested by the dashed lines 61.1 and 61.2 and are shown here as separate devices for clarity.

The controls 56 output signals for regulating the magnetic fields M1, M2 and M3, M4 along their respective planes 62.1, 62.2 and 62.3, 62.4. These planes are essentially transverse to the desired optical paths for plasma legs 45.1 and 45.2 and control the plasma paths in a manner as is well known in the art.

A straightforward geometry to make this correction for plasma jet leg 45.1 is shown in the view of FIG. 3. Localized magnetic fields that can be varied in two directions to the plasma jet path PJ1 are applied at two positions M1 and M2 along leg 45.1 of the plasma jet leg PJ1. The M1 field is closer to the electrode assembly 24. The locations of the plasma jet leg PJ1 are sensed at two positions P1 and P2. Two separate optical sensors S1 and S2 view position P1 from two directions; likewise, two separate optical sensors S3 and S4 view position P2 from two directions. For the geometry shown, one path position P1 is sensed at the magnetic field location M2 or within or in the proximity of the plane 62.2, which is further away from the electrode assembly 24 than the magnetic field location M1, and the second sensing position P2 is closer to the vertex 52.

A variation in path position sensed at PI yields a feed-back signal to change the magnetic field strength and direction applied by the magnetic field poles at M1 to bring the plasma jet path back to the corrected position at the position sensing location P1 (see the shaded solid line path for PJ1). For the 1-dimensional correction shown, a change in intensity of the magnetic field with a direction perpendicular to the paper would be required.

The path position sensing location P2, with no correction applied by the magnetic poles at M2, would sense a path position indicated by the heavy dashed line at 66. The position as sensed by P2 is fed-back to the magnetic field poles at M2 to bring the plasma jet path back to its pre-set correct position at location P2, heavy shaded line. For this correction, the direction of the magnetic field change is opposite in direction to that applied by M1. The direction and position of the leg of the plasma jet PJ1 at the vertex is now at its pre-set correct position. In this manner, any successive variations in the path direction may be corrected to give a plasma jet path with the same pre-set path direction and position at the vertex. FIG. 3 shows a 1-dimensional plasma jet path variation and correction. In practice, the path will vary in 2-dimensions and will require a corresponding 2-dimensional change in the magnetic field vector direction and amplitude within the respective planes 62.1 and 62.2 using multiple magnets 68 as shown in the view of FIG. 4 for plane 62.1.

FIG. 4 shows a cross-section in the plane of a localized applied magnetic field that is perpendicular to the direction of the plasma jet leg 45.1. As shown in this Figure, the localized magnetic fields are applied by two sets of magnetic poles 68.1, 68.2, and 68.3, 68.4. Each set of poles applies a magnetic field with a large component that is perpendicular to the direction of the plasma jet. The strength and direction of the applied magnetic fields, referred to as the magnetic field vector, can be varied to change the force on the plasma jet. The solid circle represents the plasma jet path PJ1 when the plasma jet is at its preset position and at the location where it is sensed by optical sensors S1 and S2. The dotted circle represents the plasma jet after a deviation from its preset position. In this case, the optical sensors and control system feedback a signal that changes the magnetic field vector. The changed force on the plasma jet in the location of the applied magnetic field then changes the direction of the plasma jet to bring the plasma jet position back to its preset location at the sensing position P1.

The plasma jet path PJ2 or 45.2 may be corrected in the same manner as for plasma leg PJ1.

The procedure to correct a change in the plasma jet path direction for the legs 45.1 and 45.2 using the geometry of FIG. 3 may be summarized by the following steps.

1. The PJ1 path direction as it emerges from the electrode assembly 24 changes.

2. Optical sensor position at P1 senses the deviation and using closed loop control changes the magnetic field M1 to bring the plasma jet path so that it moves to its preset position at the location sensed at P1.

3. The resulting deviation of the path position at P2 is sensed as that brings the plasma jet path along the dashed heavy shaded line 66. Using closed loop control, the magnetic field at M2 is changed to bring back the plasma jet path to its preset position at P2.

4. The same steps 1–3 apply to the correction of the path of the plasma jet leg 45.2.

By the above method, the plasma jet path may be adjusted to provide a controlled and repeatable path location and direction at the vertex 52. The resulting accuracy and stability of the plasma jet at the vertex 52 enables improved control over the processing of a substrate 50 in the manufacture of semiconductor devices.

Figure 5:
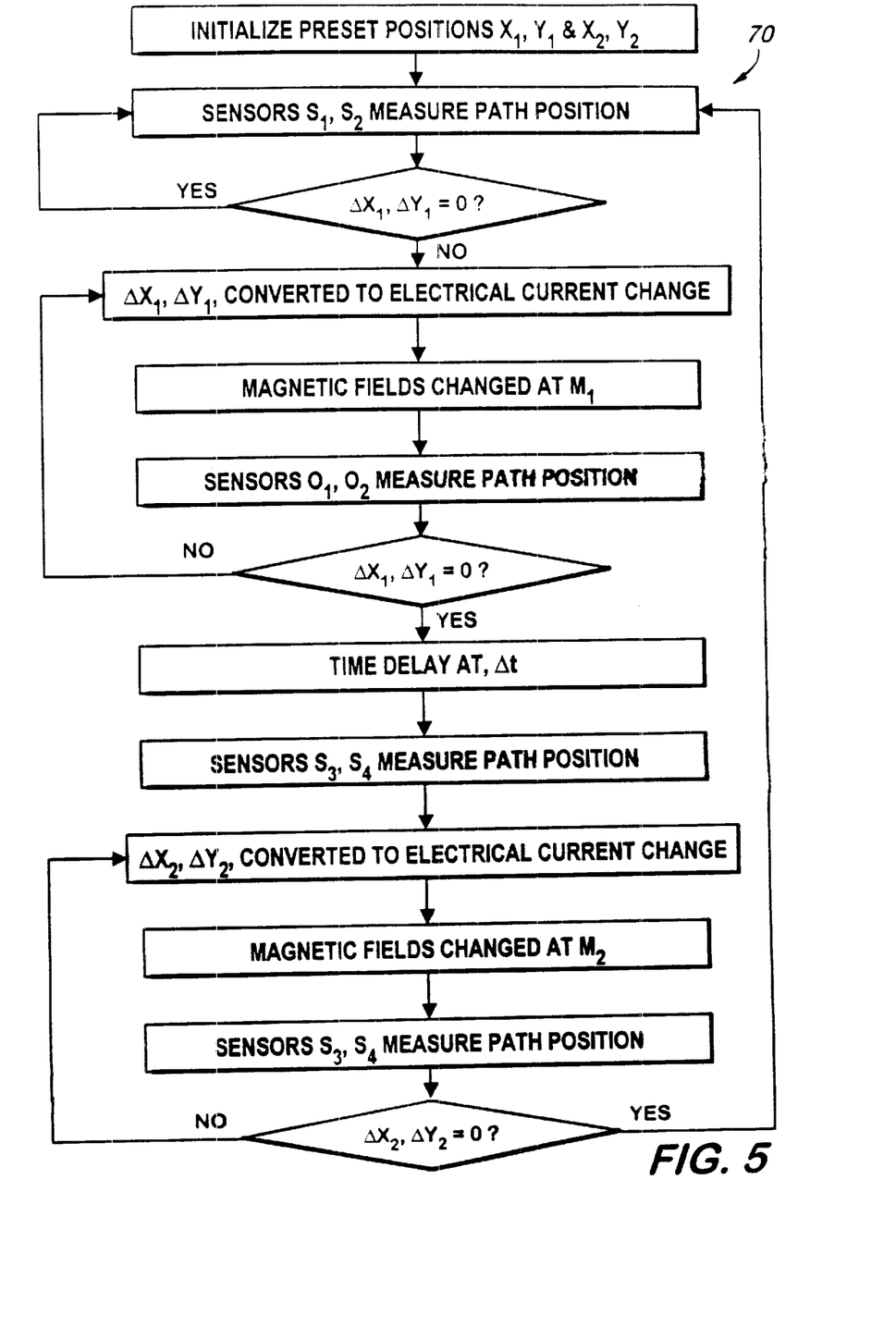
FIG. 5 is an illustrative flow chart for the operation of a processor used to maintain plasma jet control in accordance with the invention.

FIG. 5 shows an embodiment 70 for a top-level flow chart for controlling the position and direction of the plasma jet at the vertex 52 where the hot gas stream is generated. FIG. 5 shows flow chart for one leg 45.1 of the plasma jet 44. A similar flow chart would be repeated for the other leg 45.2. Initial conditions are first set-up by entering into the system controller 60 the desired positions of the plasma jet 44 at the two position sensing locations P1 and P2 measured by sensors $S_1$, $S_2$ and by sensors $S_3$, $S_4$.

In this description we use the coordinate system of x and y perpendicular to the plasma jet path and z co-incident with the plasma jet path as shown in FIG. 4. Position $(x_1, y_1)$ is the pre-set position at the location on the plasma jet measured by sensors $S_1$, $S_2$ and position $(x_2, Y_2)$ is the pre-set position at the location measured by sensors $S_3$, $S_4$. Sensors $S_1$, $S_2$ monitor the plasma jet; if they sense a deviation $\Delta x_1$, $\Delta y_1$, from the pre-set location then this deviation in the two axes is converted to electrical currents that are proportional to the deviations $\Delta x_1$, $\Delta y_1$. The conversion of the optical signal to an electrical signal follows known art in which the optical signal from sensors $S_1$, $S_2$ is focused onto a photosensitive array, such as a CCD array. The electrical outputs from the pixels of the photosensitive array are fed to a Digital Signal Processor (DSP) which, using the known geometry of the positions of the sensors $S_1$ and $S_2$, determines the center position of the plasma jet.

The DSP then outputs a change in the electrical current for $\Delta x_1$ that depends on the magnitude of $\Delta x_1$ and a similar current for $\Delta y_1$. These currents can then be amplified by a current amplifier and fed to electromagnet coils on the magnetic circuits for the magnetic fields applied at location $M_1$. The corresponding change in magnetic field corrects the position of the plasma jet path. The profile of the electrical currents providing the magnetic field change may be determined by using well known Proportional, Integral, Differential (PID) control theory.

The feedback time to sense a position time and correct the plasma jet position can be of the order of about 1 millisecond. Following a feedback correction, if the position of the plasma jet at the location sensed by $S_1$, $S_2$ is not within the system accuracy, such an accuracy may be ±0.05 mm, then the position sensed by $S_1$, $S_2$ is again used to adjust the path position by changing the magnetic field at position $M_1$ as described above. Once the deviation is within system accuracy, there may be a short time delay $\Delta t$, such as 0.1 msec, for control stability, followed by measuring the plasma jet path position near the vertex by sensors $S_3$, $S_4$.

The deviation from the initial pre-set conditions $\Delta x_2$, $\Delta y_2$ is then used to correct the plasma jet position at the location measured by $S_3$, $S_4$ by changing the magnetic fields applied at location $M_2$ in a feedback loop using a process similar to that described above for correcting the path position at the position measured by sensors $S_1$, $S_2$. When the deviation at the position measured by sensors $S_3$, $S_4$ is within system accuracy, the controller directs the system to monitor the location measured by sensors $\Delta x_1$, $\Delta y_1$. When sensors $\Delta x_1$, $\Delta y_1$ sense a path change another correction is made as described above.

It is possible that there can be some cross-leakage of the magnetic flux between the adjacent locations to which localized magnetic fields are applied; between locations $M_1$ and $M_2$ for plasma leg 45.1 and between locations $M_3$ and $M_4$ for plasma leg 45.2. Depending on the magnetic circuit design, the cross-leakage could be large enough that when, for instance, the magnetic field is changed at position M2 there could be a change in the plasma jet path position at M1. The effect of such leakage may be corrected by repeated feedback loop corrections.

A more effective method is to calibrate and compensate for the cross leakage effect. A method for this may be to empirically determine the effect of a magnetic field change at $M_2$ on the plasma jet path position at the magnetic field location $M_1$. To make this calibration, optical sensors would be placed to measure the path position at $M_1$. A dependence of any path change at $M_1$ resulting from a change in the field applied at $M_2$ is then determined. Having this calibration, the plasma jet path correction made at $M_1$, as described in the flow chart description above, can be compensated for to account for the small effect of magnetic-flux cross-leakage when the field at $M_2$ is changed. The algorithm would then direct the magnetic field change at $M_1$ to bring the deviation at the location measured by $S_1$, $S_2$ to make the correction $\Delta x_1 = d_x$ and $\Delta y_1 = d_y$, rather than $\Delta x_1 = 0$ and $\Delta y_1 = 0$, where $d_x$ and $d_y$ are the compensation values calculated from the calibration.

Figure 6:
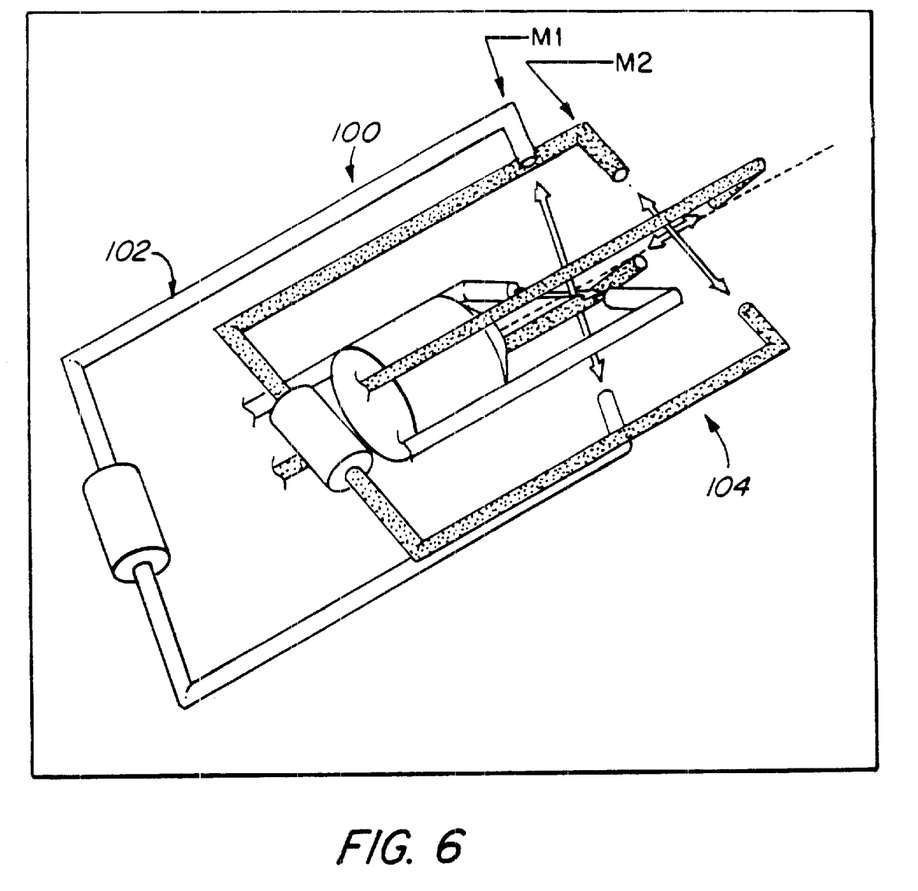
FIG. 6 is a perspective view of magnetic fields employed in the plasma jet generator in accordance with the invention.

FIG. 6 shows a layout concept for an 8-pole magnetic field system 100 for precise positioning of the plasma jet path 44 at the vertex 52. Localized magnetic fields that can be varied in direction and intensity in 2-dimensions in the plane perpendicular to the plasma jet path are applied at two locations by two sets of poles. The hatched magnetic pole circuit 102 applies the field at location M1 and the solid shaded circuit 104 at M2. For this pole configuration, pairs of poles are connected in a magnetic circuit with an electromagnet coil on each of the four pole pairs. The current through each coil is varied to change the magnetic field applied by the corresponding pole pair. The change in current to an electromagnetic coil is in response to a measured error at a given location in the path position of the plasma jet.

To provide stable feedback control of the path position, well known "Proportional/Integral/Differential" (PID) closed loop control principles may be applied. For the system shown, four coils would be needed, for simplicity two of the four coils are shown in FIG. 6. Each coil is on a magnetic circuit consisting of highly magnetically permeable material. When the current through a coil is changed, there is a corresponding change in the magnetic field applied between the poles on that portion of the magnetic circuit. The 1-dimensional correction method shown in FIG. 3 can be done in two dimensions with this 8-pole system.

For a magnetic field system that applies magnetic fields at two locations along a plasma jet, there can be a measurable fraction of the applied fields that is cross-magnetic "leakage" between the poles for the separate field locations. By using closed loop feedback from the optically sensed path positions in the manner as previously described herein, the field strength to correct the plasma jet path position to the two preset, optically sensed positions (e.g., P1 and P2 for the example of FIG. 3) can automatically compensate for the non-linearity, introduced by the magnetic field leakage, of the applied magnetic field with current to the electromagnetic coil.

A key property of the magnetic field configuration as disclosed by this invention is that the magnetic field system apply magnetic fields at two locations along a leg of the plasma jet path and that the direction and strength of the field at each position be controllable in two dimensions with components perpendicular to the plasma jet path direction. It is evident that the concept of a magnetic control system to apply localized magnetic fields at two positions along the plasma jet path may be accomplished by different pole configurations and magnetic field circuit designs. A six-pole system can also provide magnetic fields that can be changed in two directions at two locations. It is also evident that the magnetic field circuit design, the layout of the paths of the magnetically permeable material between the pole positions, may be routed along different paths.

It is also evident that a magnetic field control system that uses more than two applied magnetic field locations and, or optical sensing of more than two path position locations to feed back to two or more applied magnetic field locations to enable precise positioning of the plasma jet path and direction at the vertex such as 52 is an extension of the magnetic control system principle described herein.

Figure 8:
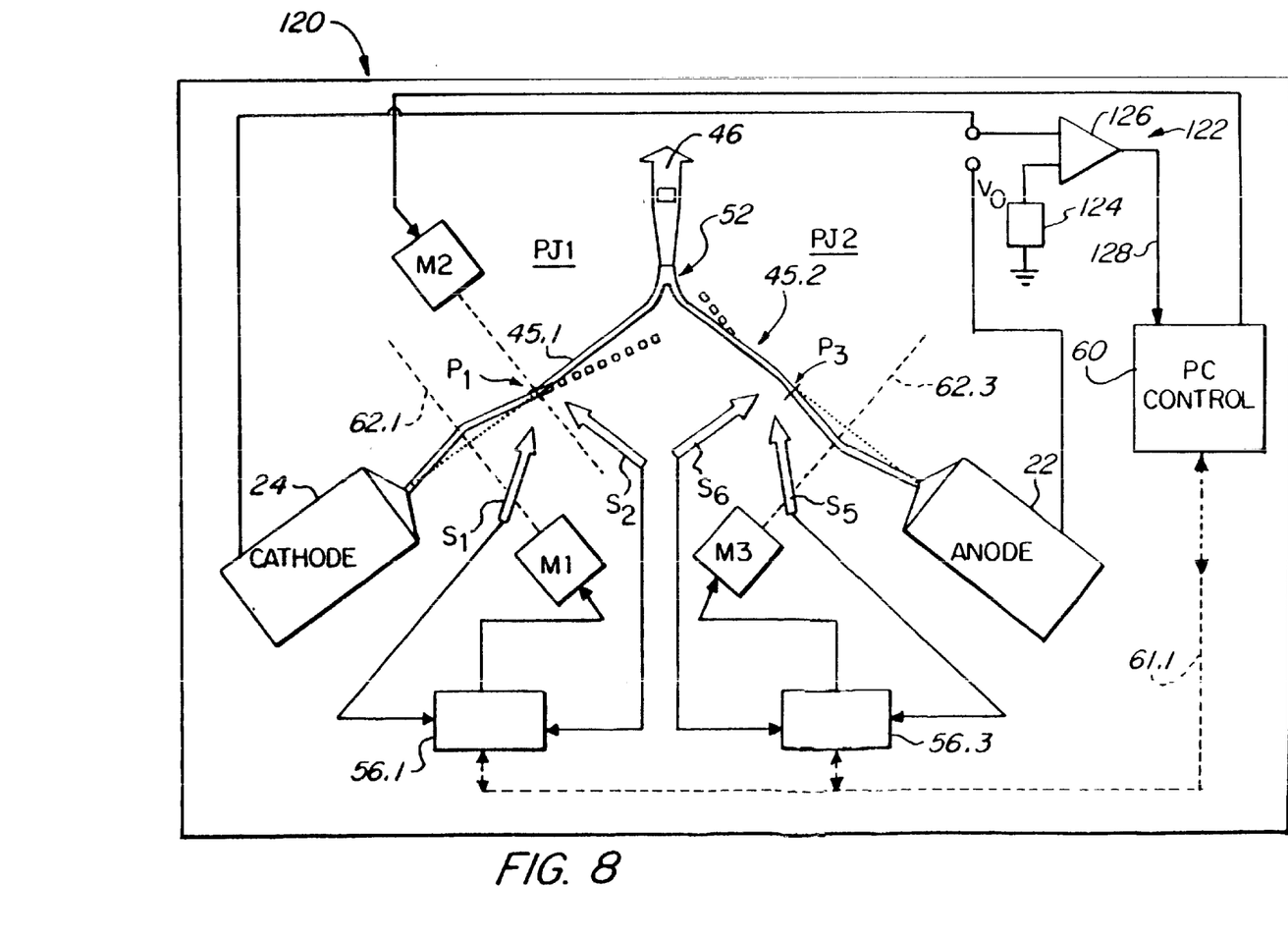
FIG. 8 is a schematic and an elevation view of still another plasma generator in accordance with the invention.

An alternate approach for control of the plasma jet path involves, as shown in FIG. 8, a system 120 using feedback from the voltage measured across the combined plasma jet. The combined plasma jet generated by the cathode and anode electrode assemblies 22, 24 has characteristics of an arc discharge with a relatively high current, on the order of 100A, and a relatively low voltage, on the order of 100–200 V, referred here as $V_{arc}$. A significant fraction of the voltage drop, $V_{arc}$, occurs across the vertex 52 area where the current flow diffuses between the two arms of the combined plasma jet, PJ1 and PJ2 as also shown in FIG. 3. A change in the path position at the vertex 52 can be empirically correlated to the measured $V_{arc}$. More specifically, a path position change that increases the distance between the paths of the two plasma jets at the vertex 52 increases $V_{arc}$. $V_{arc}$ can then be used with an algorithm that uses the dependence of $V_{arc}$ on the path position in a control algorithm to feedback a measured deviation in $V_{arc}$ to the applied magnetic field in conjunction with, or in place of, a second optically sensed position of the plasma jet path. The applied magnetic field would then be adjusted to restore $V_{arc}$ to its preset value using the deviation in $V_{arc}$.

The voltage $V_{arc}$ is applied to deviation sensor 122. This can be in many forms, such as digital but is shown here in analog form for clarity. The sensed voltage is compared with a reference value 124, $V_o$, by a comparator 126 which generates the deviation signal $\Delta V_{arc}$ on line 128. The deviation signal is then entered into the microprocessor 60. Alternatively the sensed voltage can be converted to a digital signal and applied to processor 60. Within the processor the digitized signal is compared with a reference signal stored in memory and the error signal, the deviation signal $\Delta V_{arc}$ used in the flow chart of FIG. 9.

Figure 9:
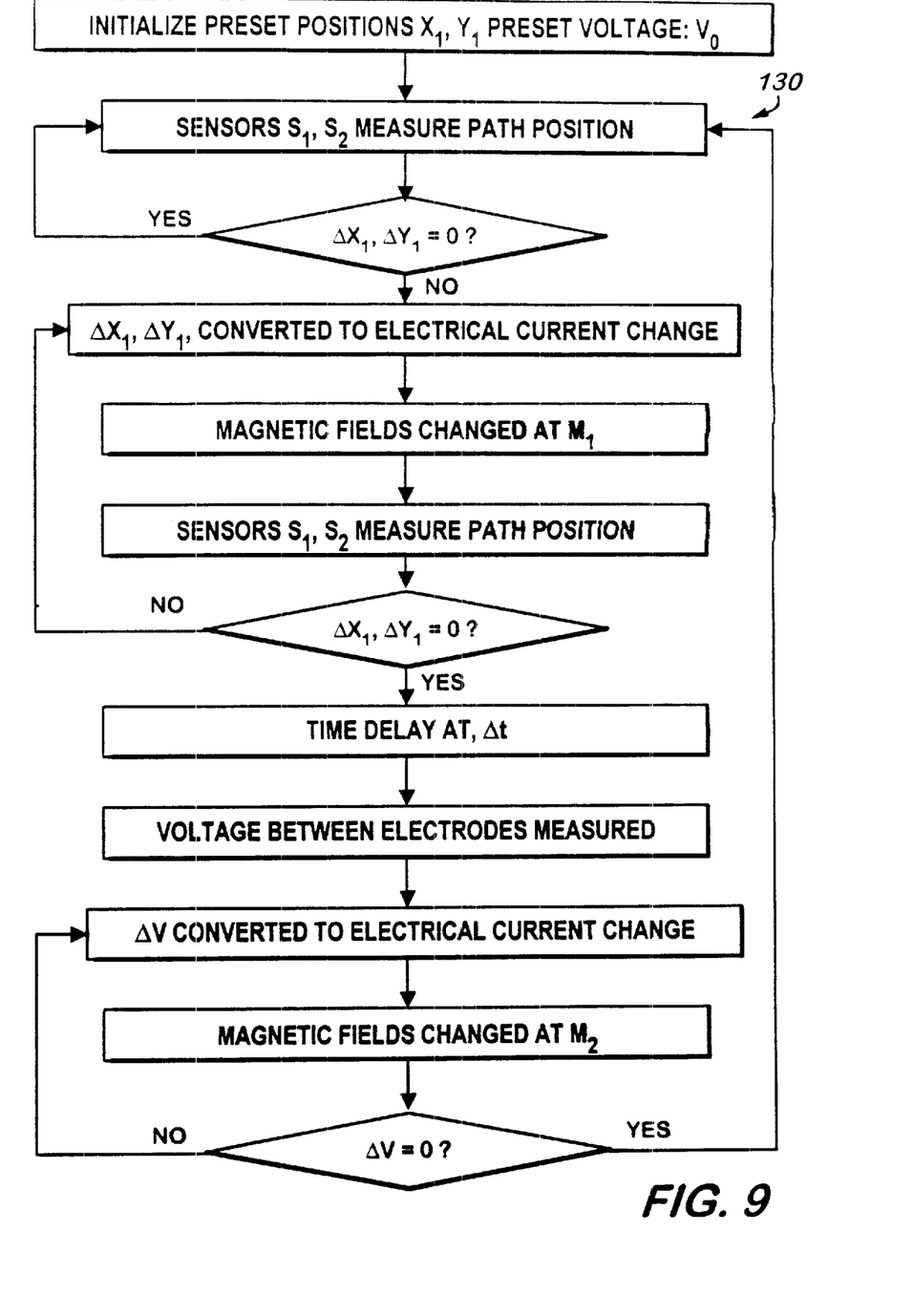
FIG. 9 is an illustrative flow chart for the operation of a processor used to maintain plasma jet control in an embodiment as shown in FIG. 8.

FIG. 9 shows a control system 130 for a top-level flow chart 132 of an algorithm for controlling the position and direction of the plasma jet at the vertex 52 by using, as shown by the schematic of FIG. 8, $V_{arc}$ in place of a set of optical sensing monitors. The control system 130 is initialized with a preset plasma jet path position at the location measured by sensors $S_1, S_2$ and by a pre-set arc voltage $V_o$. As described in reference to FIG. 5, if sensors $S_1$, $S_2$ measure a change $\Delta x_1$, $\Delta y_1$ in the plasma jet path position then the deviations $\Delta x_1$, $\Delta y_1$ are converted to current changes which change the magnetic field applied at $M_1$ to correct for the path deviation. After a possible short time delay $\Delta t$ for system stability, the deviation $\Delta V$ from $V_o$ is measured, $\Delta V = V_{arc} - V_o$.

The measured dependence of $V_{arc}$ on path distance between the two legs of the plasma jet at the vertex, $\Delta V$ is converted to a current change and, using well know PID control theory, the magnetic field at $M_2$ is changed to bring $\Delta V = 0$; this may be done by only changing the y-axis coordinate. In this way the voltage, which is primarily responsible for the heating of the hot gas stream, is kept constant. However, the position and direction of the hot gas stream at the vertex is not as precisely controlled as it is for the control system of FIG. 3 and the flow chart of FIG. 5. The advantage of this system 120 is the simplification of eliminating an optical control system while reducing the non-repeatability in the hot gas generation.

The magnetic field system such as shown in FIG. 3 is applied to each arm of the plasma jet, namely, the plasma jet from the cathode electrode assembly and the plasma jet from the anode assembly (PJ1 and PJ2 of FIGS. 3 and 7). As previously described, the major variation in the direction of the plasma jet occurs at the cathode assembly as it emerges from the electrode assembly 24. A significant improvement to the control of the hot gas stream generated at the plasma jet vertex 52, can still be obtained by using the system for path position as shown in FIG. 7 on just the cathode arm of the combined plasma jet. Hence, the sensing of the location of the plasma jet at two locations with control from applied magnetic fields at two locations can be done for plasma leg PJ1 or 45.1, and can be dispensed with for plasma leg 45.2 or PJ2.

Having thus described an improved technique and apparatus for controlling a plasma jet used in the manufacture of semi-conductor devices, the advantages and objects of the invention can be understood. Variations of the described embodiment can be made without departing from the scope of the invention as defined by the following claims.

What is claimed is:

1. A plasma jet generator for the treatment of a substrate in the manufacture of semiconductor devices, comprising:
   a cathode assembly and an anode assembly positioned to each generate a leg of a plasma jet operative therebetween, wherein the plasma jet has a vertex where a hot gas to treat the substrate is produced;
   a magnetic field system positioned around at least the cathode leg of the plasma jet, said magnetic field system having at least two position controlling magnetic fields spaced apart along the plasma jet leg such that a deflection of the cathode leg by a first position controlling magnetic field enables the other, spaced apart, magnetic field to re-deflect the cathode leg to precisely control both the position and direction of the cathode leg of the plasma jet near the vertex.

2. The plasma jet generator as claimed in claim 1 and further including:
   plasma jet position sensors oriented to sense the position of the cathode leg of the plasma jet at spaced apart locations along the plasma jet; said sensors generating output signals indicative of two spaced apart sensed positions of the cathode leg of the plasma jet; and
   feedback controls responsive to the output signals from the plasma jet position sensors to produce control signals that are effectively applied to the magnetic field system to adjust the cathode plasma jet leg in a direction selected to provide the desired position and direction of the cathode plasma jet leg at said vertex.

3. A plasma generator as claimed in claim 2 wherein said plasma jet position sensor, which is located nearer to the vertex, is operatively oriented at a magnetic field system that is nearest to the vertex.

4. A plasma generator as claimed in claim 3 wherein there are at least two plasma jet path sensing locations along said cathode leg of the plasma jet with one centered on the applied magnetic field system nearest to the vertex.

5. A plasma jet generator as claimed in claim 1 and further including:
   a plasma jet position sensor located to sense the position at one location of the cathode leg of the plasma jet and produce a sensor signal indicative thereof;
   a voltage deviation sensor effectively coupled between the cathode and anode to generate a deviation signal indicative of a desired change in the position of the cathode leg of the plasma jet at a second location; and
   a controller responsive to said sensor signal and said deviation signal to vary the magnetic field system to establish a desired position and direction of the plasma jet at said vertex.

6. A plasma jet generator as claimed in claim 1 wherein said anode leg of the plasma jet has a pair of anode leg associated magnetic field systems to position and direct the anode leg; and
   wherein said anode leg is provided with a pair of plasma jet position sensors oriented to sense the position of the anode leg of the plasma jet at spaced apart locations along the plasma jet; said sensors generating output signals indicative of two spaced apart sensed positions of the anode leg of the plasma jet; and
   feedback controls responsive to the output signals from the anode leg plasma jet position sensors to produce anode control signals that are effectively applied to the anode leg associated magnetic field systems to adjust the anode plasma jet leg in a direction selected to provide the desired position and direction of the plasma jet at said vertex.

7. A plasma jet generator as claimed in claim 1 wherein the position of the plasma jet is sensed at least at two locations on each leg of the plasma in two dimensions perpendicular to the plasma jet path to move the plasma jet in two directions.

8. A plasma jet generator as claimed in claim 7 and a feedback loop to move the plasma jet with the magnetic field systems based on said sensed plasma jet positions.

9. A plasma jet generator as claimed in claim 7 wherein said magnetic field systems control the plasma jet position and direction in the vertex area.

10. A plasma jet generator as claimed in claim 2 wherein said plasma jet position sensors determine the geometry of the positions of the plasma jet to vary the magnetic field systems to adjust the plasma jet position.

11. A plasma jet generator as claimed in claim 1 and further including a closed loop control to compensate for magnetic field leakage.

12. A plasma jet generator as claimed in claim 2 wherein said magnetic field systems comprises eight poles to apply and vary magnetic field intensities and directions at least at two positions on the plasma jet.

13. A plasma jet generator as claimed in claim 2 wherein said magnetic field systems comprises six poles to apply and vary magnetic field intensities and directions at least at two positions on the plasma jet.

14. A method for controlling a plasma jet used in the manufacture of semiconductor devices to treat a substrate, comprising the steps of:

forming a plasma jet with a cathode assembly and an anode assembly, wherein the plasma jet has a vertex where a hot gas to treat the substrate is produced;

forming spaced apart magnetic fields around at least the cathode leg of the plasma jet, one of said magnetic fields re-deflecting said cathode leg deflected by another magnetic field to enable said magnetic fields in the aggregate to precisely control the position and direction of the cathode leg of the plasma jet near the vertex.

15. A plasma jet generator for the treatment of substrate in the manufacture of semiconductor devices, comprising:

a plasma generator having a cathode and an anode with a voltage therebetween and with the cathode producing a cathode plasma jet and the anode producing an anode plasma jet, with the cathode and anode plasma jets being directed to converge at a vertex for producing a hot gas stream from the vertex onto a substrate;

a first and at least a second magnetic jet positioning control spaced apart along at least said cathode plasma jet to control the position of the cathode plasma jet at last two spaced-apart locations;

a first cathode plasma jet sensor for detecting a first deviation in the position of the cathode plasma jet at a first sensor location relative to a first desired position;

a second cathode plasma jet sensor for producing a signal representative of a second deviation in the position of the cathode plasma jet relative to a second desired position.

16. A plasma jet generator for the treatment of a substrate in the manufacture of semiconductor devices, comprising:

a cathode assembly and an anode assembly positioned to each generate a leg of a plasma jet operative therebetween, wherein the plasma jet has a vertex where a hot gas to treat the substrate is produced;

a magnetic field system positioned around one of the legs of the plasma jet, said magnetic field system having at least two position controlling magnetic fields spaced apart along the plasma jet leg such that a deflection of said one leg of the plasma jet by a first position controlling magnetic field enables the other, spaced apart, magnetic field to re-deflect the one leg to precisely control both the position and direction of the on leg of the plasma jet near the vertex.

17. A method for controlling a plasma jet used in the manufacture of semiconductor devices to treat a substrate, comprising the steps of:

forming a plasma jet with a cathode assembly and an anode assembly, wherein the plasma jet has a vertex where a hot gas to treat the substate is produced;

forming spaced apart magnetic fields around at least one of the legs of the plasma jet, one of said magnetic fields re-deflecting said one leg deflected by another magnetic field to enable said magnetic fields in the aggregate to precisely control the position and direction of said one leg of the plasma jet near the vertex.

* * * * *